(12) United States Patent
Dhong et al.

(10) Patent No.: US 6,914,453 B2
(45) Date of Patent: Jul. 5, 2005

(54) INTEGRATED LOGIC AND LATCH DESIGN WITH CLOCK GATING AT STATIC INPUT SIGNALS

(75) Inventors: Sang Hoo Dhong, Austin, TX (US); Hwa-Joon Oh, Austin, TX (US); Joel Abraham Silberman, Somer, NY (US); Naoka Yano, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 10/616,850

(22) Filed: Jul. 10, 2003

(65) Prior Publication Data

US 2005/0007152 A1 Jan. 13, 2005

(51) Int. Cl.[7] .............................................. H03K 19/096
(52) U.S. Cl. ............................. 326/98; 326/95; 326/93
(58) Field of Search ............................. 326/93, 95, 98; 327/208–212, 214, 215, 224, 225

(56) References Cited

U.S. PATENT DOCUMENTS 5,821,775 A * 10/1998 Mehta et al. ................. 326/98
6,204,696 B1 * 3/2001 Krishnamurthy et al. ..... 326/98

* cited by examiner

Primary Examiner—Vibol Tan
(74) Attorney, Agent, or Firm—Carr LLP; Diana R. Gerhardt (57) ABSTRACT

A method and an apparatus are provided for implementing a logic circuit with integrated logic and latch design. A clock input is provided to the logic circuit. One or more static signal inputs are further provided to the logic circuit. One or more dynamic signal inputs are generated by dynamically gating the one or more static signal inputs with the clock signal. The one or more dynamic signal inputs are applied to the logic circuit, and one or more dynamic signal outputs of the logic circuit are generated. The one or more dynamic signal outputs are precharged, and the one or more dynamic signal outputs are evaluated. The one or more dynamic signal outputs are held when the one or more dynamic signal outputs are neither being precharged nor being evaluated. The one or more dynamic signal outputs are converted into one or more static signal outputs.

23 Claims, 4 Drawing Sheets

INTEGRATED LOGIC AND LATCH DESIGN WITH CLOCK GATING AT STATIC INPUT SIGNALS

BACKGROUND OF THE INVENTION

1. Field of the Invention

The invention relates generally to electronic circuitry and, more particularly, to integrated logic and latch circuitry.

2. Description of the Related Art

In the modern circuit design of a pipelined microprocessor, clocked latches are the basic building blocks. In a simple circuit implementation of the pipeline microprocessor, for example, inputs are stored at a first clocked latch, processed by a first logic unit, stored again at a second clocked latch, processed by a second logic unit, and stored again at a third clocked latch, which generates outputs. The inputs and outputs can be static or dynamic signals. In general, dynamic implementation achieves a faster speed with higher power consumption.

Power consumption of a large system is one of the most important design factors in the microprocessor design. In a large, complex microprocessor design, static signals are chosen because they consume less power than dynamic implementation. But this choice comes at a price of a slower speed.

Therefore, a need exists for achieving lower power consumption and a faster speed at the same time in a microprocessor design.

SUMMARY OF THE INVENTION

The present invention provides a method and an apparatus for implementing a logic circuit with integrated logic and latch design. A clock input is provided to the logic circuit. One or more static signal inputs are further provided to the logic circuit. One or more dynamic signal inputs are generated by dynamically gating the one or more static signal inputs with the clock signal. The one or more dynamic signal inputs are applied to the logic circuit, and one or more dynamic signal outputs of the logic circuit are generated. The one or more dynamic signal outputs are precharged based on the clock signal, and the one or more dynamic signal outputs are evaluated when the one or more dynamic signal outputs are not being precharged. The one or more dynamic signal outputs are held when the one or more dynamic signal outputs are neither being precharged nor being evaluated. The one or more dynamic signal outputs are converted into one or more static signal outputs.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, it will be apparent to those skilled in the art that the present invention may be practiced without such specific details. In other instances, well-known elements have been illustrated in schematic or block diagram form in order not to obscure the present invention in unnecessary detail.

It is further noted that, unless indicated otherwise, all functions described herein may be performed in either hardware or software, or some combination thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
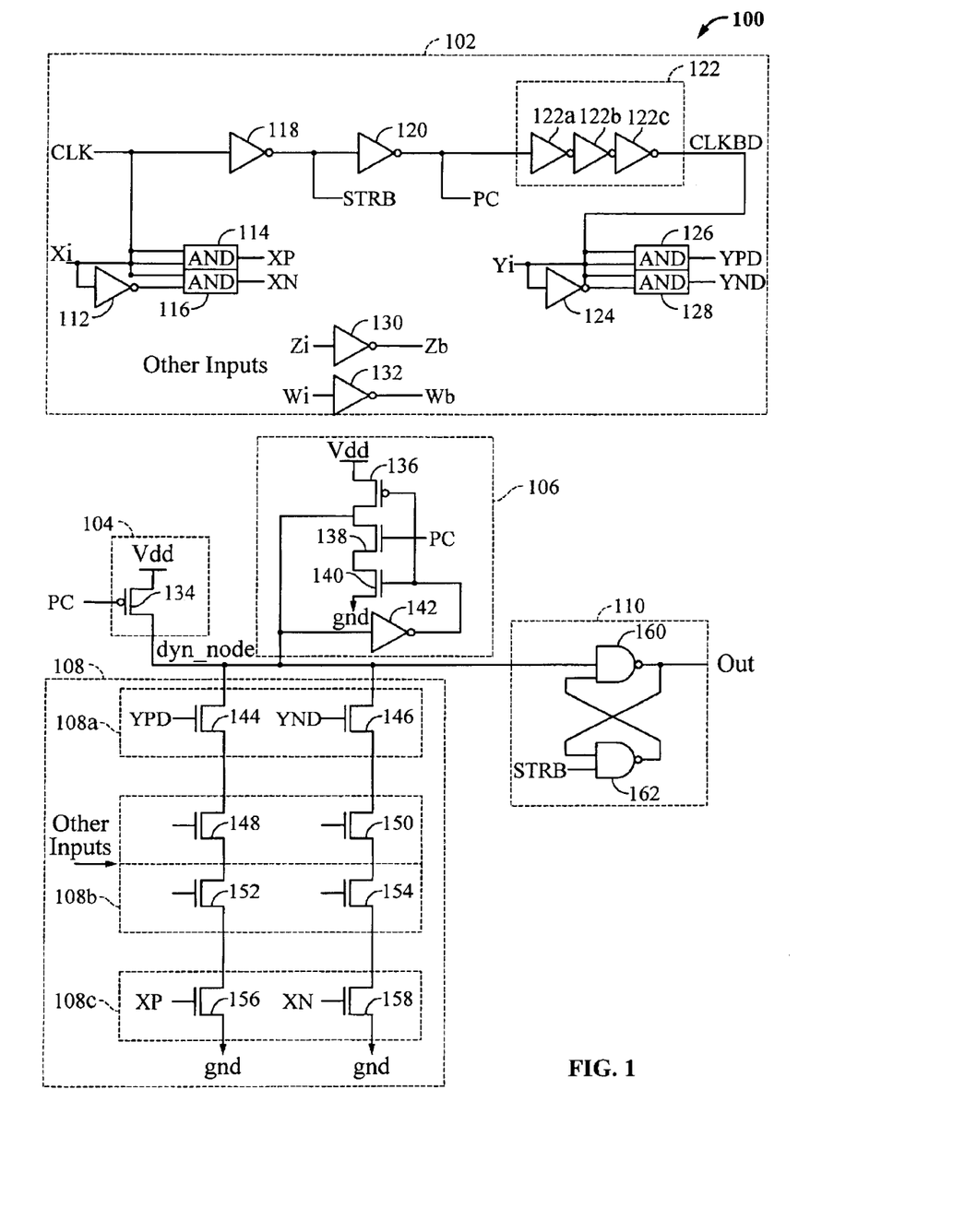
FIG. 1 depicts a schematic diagram of an integrated logic and latch circuit.

Referring to FIG. 1 of the drawings, the reference numeral 100 generally designates a schematic diagram of an integrated logic and latch circuit. The integrated logic and latch circuit 100 comprises a clock gating circuit 102, a precharge circuit 104, a keeper circuit 106, an evaluation logic circuit 108, and a conversion circuit 110. The integrated logic and latch circuit 100 is shown to receive a clock signal CLK and four static signal inputs (Xi, Yi, Zi, and Wi) and generate a static signal output OUT. This specific configuration including the number of signal inputs may vary depending on a specific logic circuit to be implemented according to the present invention, without departing from the true spirit of the present invention.

The clock gating circuit 102 is configured for receiving the clock signal CLK and one or more static signal inputs (e.g., Xi, Yi, Zi, and Wi) and for generating one or more dynamic signal inputs (e.g., XP, XN, YPD, and YND) by dynamically gating Xi and Yi with the clock signal CLK. The evaluation logic circuit 108 is coupled both to the clock gating circuit 102 for receiving the one or more dynamic signal inputs (e.g., XP, XN, YPD, and YND) and to a dynamic node dyn_node for carrying a dynamic signal output (not shown) of the evaluation logic circuit 108.

The precharge circuit 104 is coupled to the dynamic node dyn_node for precharging the dynamic node dyn_node based on the clock signal CLK. The dynamic node dyn_node is evaluated when the precharge circuit 104 is not precharging the dynamic node dyn_node. The keeper circuit 106 is coupled to the dynamic node dyn_node for holding the dynamic signal output (not shown) when the dynamic node dyn_node is neither being precharged nor being evaluated. The conversion circuit 110 is coupled to the dynamic node dyn_node for converting the dynamic signal output (not shown) into the static signal output OUT.

The clock gating circuit 102 comprises a first inverter 112, a first AND logic circuit 114, and a second AND logic circuit 116, a second inverter 118, a third inverter 120, a delay block 122, a fourth inverter 124, a third AND logic circuit 126, a fourth AND logic circuit 128, a fifth inverter 130, and a sixth inverter 132. In the clock gating circuit 102, the first AND logic circuit 114 receives the clock signal CLK and a first static signal input Xi and generates a first dynamic signal input XP.

The first inverter 112 receives the first static signal input Xi and generates a first complement static signal input (not shown). The second AND logic circuit 116 receives the clock signal CLK, is coupled to the first inverter 112 for receiving the first complement static signal input (not shown), and generates a first complement dynamic signal input XN. The second inverter 118 receives the clock signal and generates an STRB signal. The third inverter 120 is coupled to the second inverter 118 for receiving the STRB signal and generates a PC signal. The delay block 122 is coupled to the third inverter 120 for receiving the PC signal and generates a CLKBD signal. Preferably, the delay block 122 includes three inverters 122a, 122b, and 122c. Note that STRB is the inverted signal of CLK. Also, PC is a delayed signal of CLK with the same polarity, and CLKBD is a further delayed and inverted signal of CLK.

The third AND logic circuit 126 is coupled to the delay block 122 for receiving the CLKBD signal, receives a second static signal input Yi, and generates a second dynamic signal input YPD. The fourth inverter 124 receives the second static signal input Yi and generates a second complement static signal input (not shown). The fourth AND logic circuit 128 receives the CLKBD signal, is coupled to the fourth inverter 124 for receiving the second complement static signal input (not shown), and generates a second complement dynamic signal input (YND).

Optionally, the fifth inverter 130 receives a third static signal input Zi and generates Zb. The sixth inverter 132 receives a fourth static signal input Wi and generates a fourth complement static signal input Wb. In general, either or both of the fifth inverter 130 and the sixth inverter 132 may be omitted when there are only two static inputs for the logic to be implemented. Likewise, more inverters may be added to include additional static inputs, if there are more than four static inputs.

The precharge circuit 104 comprises a first p-channel metal-oxide-silicon (PMOS) transistor 134 coupled between a supply voltage Vdd and the dynamic node dyn_node and also coupled to the clock gating circuit 102 for receiving the PC signal, the PC signal controlling the PMOS transistor. Note that the first PMOS transistor 134 functions as an electronic switch and is therefore replaceable with a different device having similar functionality, without departing from the true spirit of the present invention. This applies to other transistors shown herein whenever applicable.

As is well known in the art, the PMOS transistor has source, gate, and drain terminals. The source terminal of the first PMOS transistor 134 is coupled to the supply voltage Vdd. The gate terminal of the first PMOS transistor 134 is coupled to the clock gating circuit 102 for receiving the PC signal. The drain terminal of the first PMOS transistor 134 is coupled to the dynamic node dyn_node.

The keeper circuit 106 comprises a seventh inverter 142, a second PMOS transistor 136, a first n-channel metal-oxide-transistor transistor (NMOS) 138, and a second NMOS transistor 140. Specifically, the seventh inverter 142 is coupled to the dynamic node dyn_node for receiving the dynamic signal output (not shown) and generates an inverted dynamic signal output (not shown).

The second PMOS transistor 136 is coupled between the supply voltage Vdd and the dynamic node dyn_node and also coupled to the seventh inverter 142 for receiving the inverted dynamic signal output (not shown) as a control signal (not shown). The first NMOS transistor 138 and the second NMOS transistor 140 are coupled in series between the dynamic node dyn_node and ground. The first NMOS transistor 138 is coupled to the clock gating circuit 102 for receiving the PC signal as a control signal. The second NMOS transistor 140 is coupled to the seventh inverter 142 for receiving the inverted dynamic signal output (not shown) as a control signal. As noted above, the MOS transistors 136, 138, and 140 each function as an electronic switch and are therefore replaceable with a different device having similar functionality, without departing from the true spirit of the present invention.

The conversion circuit comprises a first NAND gate 160 and a second NAND gate 162. The first NAND gate 160 and the second NAND gate 162 are cross-coupled to each other and are collectively called a cross-coupled NAND herein. The first NAND gate 160 is coupled to the dynamic node for receiving the dynamic signal output. The second NAND gate 162 is coupled to the clock gating circuit 102 for receiving the CLKBD signal.

The evaluation logic circuit 108 generally comprises a tree of NMOS transistors, and the tree is coupled between the dynamic node dyn_node and ground. Specifically, the tree comprises top, middle, and bottom portions, which portions are numbered 108a, 108b, and 108c, respectively. The top portion 108a is coupled to the clock gating circuit 102 for receiving the second dynamic signal input YPD and the second complement dynamic signal input YND. The middle portion 108b is coupled to the clock gating circuit 102 for receiving Zb and the fourth complement static signal input Wb. The bottom portion 108c is coupled to the clock gating circuit 102 for receiving the first dynamic signal input XP and the first complement dynamic signal input XN.

The top portion 108a comprises a third NMOS transistor 144 and a fourth NMOS transistor 146. YPD and YND control the third NMOS transistor 144 and the fourth NMOS transistor 146, respectively. The middle portion 108b comprises a fifth NMOS transistor 148, a sixth NMOS transistor 150, a seventh NMOS transistor 152, and an eighth NMOS transistor 154. The bottom portion 108c comprises a ninth NMOS transistor 156 and a tenth NMOS transistor 158. XP and XN control the ninth NMOS transistor 156 and the tenth NMOS transistor 158, respectively. Note that the number and/or type of the transistors used in each portion may vary depending on the specific configuration of the logic circuit to be implemented, without departing from the true spirit of the present invention.

In designing the integrated logic and latch circuit 100, two inputs Xi and Yi are selected from the input vectors of the Boolean equation of a desired logic circuit to be implemented. Xi and the complement of Xi are clock gated (i.e. AND with CLK) and go to the bottom portion 108c of the NMOS tree of the evaluation logic circuit 108. The bottom portion 108c is the collection of NMOS transistors located at the bottom of the NMOS tree. The one terminal of those transistors is connected to ground directly. Yi and the complement of Yi are clock gated with delayed clock (CLKBD) (i.e. AND with CLKBD) and go to the top portion 108a. The top portion 108a is located at the top of the evaluation logic circuit 108 and is connected to the dynamic node dyn_node. Other inputs and/or their complement logic levels go to the middle portion 108b located between the top portion 108a and the bottom portion 108c in the evaluation logic circuit 108. Those input signals do not have to be clock gated.

CLK is the main clock signal input. It can initiate the logical operation with its rising or falling edge. The STRB signal is used at the conversion circuit 110, which converts a dynamic signal of dyn_node to a static signal, OUT. The PC signal (i.e., precharge) has the same phase as that of CLK; however, it is delayed after one inversion of the STRB signal. The CLKBD signal has the opposite phase of that of the CLK signal and it is delayed through the delay block 122.

Once selected, two input signals (Xi and Yi) are clock gated, then XP, XN, YPD, and YND are generated. Those signals are applied to the evaluation logic circuit 108.

Table 1 is shown herein to provide a truth table of the cross-coupled NAND block of the conversion circuit 110.

TABLE 1

| dyn_node | STRB | OUT | Operation |
|---|---|---|---|
| 0 | 0 | 1 | Set |
| 0 | 1 | 1 | Set |
| 1 | 0 | 0 | Reset |
| 1 | 1 | Previous | Hold |

When dyn_node is low, OUT is always high, regardless the value of STRB. This operation is called 'set'. When dyn_node is high, the OUT signal changes according to the STRB signal. If the STRB signal is low with a high dyn_node, OUT becomes low. This operation is called 'reset'. If both STRB and dyn_node become high, the OUT signal does not change and remains the same as its previous logic level.

In the operation of the integrated logic and latch circuit 100, the evaluation logic circuit 108 may or may not discharge the dyn_node depending on the logical function results of the evaluation logic circuit 108. During the precharge phase when the PC signal is low, the dyn_node remains at a high level because the PMOS transistor 134 is turned on. In the evaluation phase, the PMOS 134 is disabled, and thus the dyn_node is floating at the moment. If the evaluation logic circuit 108 does not discharge the dyn_node, then the keeper circuit 106 keeps the dyn_node at a high level.

The keeper circuit 106 prevents the charge sharing problem, which occurs when partial transistors are turned on in the evaluation logic circuit 108. Also, the keeper circuit 106 helps the PMOS transistor 134 maintain the dyn_node at a high level in the precharge phase. The keeper circuit 106 also helps the dyn_node keep its discharged logic level (i.e., a logical 0) in the evaluation phase when the operational frequency is low. The keeper circuit 106 provides the dyn_node with the path to ground once the dyn_node is discharged through the evaluation logic circuit 108.

There are numerous advantages of the present invention over the prior art. Examples of such advantages are as follows.

First, the present invention facilitates a faster speed of the logic operation than the prior art. Since the size of a PMOS transistor in a static CMOS design is relatively bigger than its NMOS counterpart, the elimination of PMOS transistors at the dynamic circuit (e.g., no PMOS transistors in the evaluation logic circuit 108) reduces the total capacitance of its input signals. Less capacitance results in faster speed in the circuit. Complex CMOS logic in the prior art is converted to the simple NMOS tree logic in this design. The nature of dynamic input signals to the NMOS tree is generated by the clock gating the input signals. The latching capability of the cross-coupled NAND and dynamic circuit techniques of the faster signals results in a shorter delay than the delay of the complex logic and separate latch implementation in the prior art.

Second, all input and output signals (Xi, Yi, Zi, Wi, and OUT) are static signals. Input signals can be true or complement signals in this design. In typical domino logic in the prior art, only the transition from 0 to 1 is allowed at the input signals at cascaded domino implementation. In the present invention, either transition (0 to 1 or 1 to 0) is allowed once the setup requirement is met. Thus, there is no compatibility issue in combining the present invention with static circuits. Output signals are also static signals. The input signals are required to return to 0 at the precharge phase, unlike the prior art domino logic. The OUT signal transition occurs at the beginning of the evaluation phase, and those outputs stay at the same logic level until the next evaluation phase begins.

There is a brief transient period in the output signals only in the transition from 1 to 1. This transient period occurs when the current output is 1 and the next output is also 1. It is a very short period and can be compensated by adjusting the delay in the inverter and the second NAND 162. Other output transitions such as 0 to 0, 0 to 1, and 1 to 0 do not have any transient period. Since its output also keeps the value until the end of the precharge phase, it can be used extensively in the static circuit design, which is very important in low power design.

The third advantage of the present invention is that no foot transistor is required in the evaluation logic circuit 108. Typically, in a prior art domino logic gate, a foot transistor is required. Usually this transistor is larger than other transistors, since it has to deliver a discharge path to all the other transistors in the domino logic circuit. In the present invention, however, such a foot transistor is not needed. The depth of the NMOS transistor tree is important in faster and smaller circuit implementation. In the high performance design practice, there is a limitation as to how many NMOS transistors can be serially connected together (i.e., the depth of the NMOS transistor tree). Without this foot transistor, the depth is reduced by one transistor, thereby resulting in faster speed and smaller area.

The fourth advantage is that the operational frequency of the circuit can be lowered to DC condition. For low-power application, the frequency reduction is a typical technique. In near DC condition, the precharge phase will keep the dyn_node high. In the evaluation phase, which will be very long, once it is decided whether the dyn_node is discharged or not, the keeper circuit 106 holds the dyn_node value permanently. The keeper circuit 106 is designed to hold 0 or 1 in the dyn_node regardless the frequency of the evaluation phase.

The fifth advantage is that the hold time at the input signals is fixed regardless of the system clock frequency (i.e., the frequency of the clock signal CLK). Some prior art dynamic circuit designs require a half-cycle hold time. In a very low frequency operation, the half-cycle hold time requirement is not desirable. In the present invention, the hold time is decided at the delay of the delay block 122. Since the delay block 122 determines the end of the evaluation phase, the hold time will be fixed for input signals. Hence, the present invention is suitable for a low-frequency operation as well as a high-frequency operation.

Figure 2:
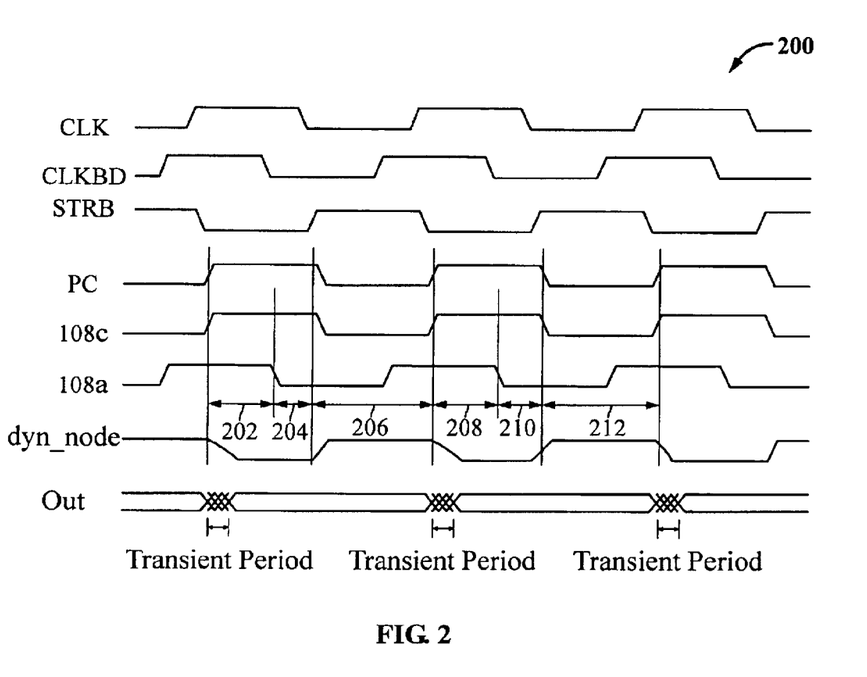
FIG. 2 depicts a timing diagram of the integrated logic and latch circuit of FIG. 1.

Now referring to FIG. 2, a timing diagram 200 illustrates a general operation of the integrated logic and latch circuit of FIG. 1. As mentioned above, CLK is the clock signal, and STRB is the inverted signal of CLK. PC is a delayed signal of CLK with the same polarity, and CLKBD is a further delayed and inverted signal of CLK. The operation of the integrated logic and latch circuit 100 includes three phases: precharge, evaluation, and hold phase. In the timing diagram 200, reference numerals 202, 204, and 206 designate an evaluation phase, a hold phase, and a precharge phase, respectively. Likewise, reference numerals 208, 210, and 212 designate an evaluation phase, a hold phase, and a precharge phase, respectively.

After CLK becomes high, the STRB signal becomes low one inverter delay later. Since the dyn_node is at high in the precharge phase, OUT becomes low as STRB becomes low. If output was low before a transition of the STRB signal, OUT does not change. However, if OUT was high before a transition of the STRB signal, then OUT changes to low for a short period of time. This is called a transient period.

After the STRB signal becomes low, the PC signal becomes high. This is the beginning of an evaluation phase. The top portion 108a and the middle portion 108b of FIG. 1 have already been evaluated and the bottom portion 108c starts its evaluation process. If there exists at least one discharge path in the evaluation logic circuit 108 of FIG. 1, the voltage at the dyn_node starts decreasing by discharging through the discharge path. If there is no such path in evaluation logic circuit 108 of FIG. 1., then the dyn_node stays at a high level. Since the STRB signal is low, the OUT signal is dependent upon the dyn_node signal. If it discharges to GND, Out becomes high, and if dyn_node stays high without any discharge, OUT becomes low. Thus, at the evaluation phase, the desired logic function is performed and the correct OUT signal is generated. The OUT signal is always the opposite value of the dyn_node when STRB is low.

After a predefined delay by the delay block 122 of FIG. 1, the CLKBD signal becomes low, and both the third NMOS transistor 144 and the fourth NMOS transistor 146 in the top portion 108a of FIG. 1 are turned off, since all Yi signals are gated off by the low CLKBD signal. This cuts off any discharge path if there was one. This is the start of a hold phase. The dyn_node signal keeps its signal value while all the discharge paths in the evaluation logic circuit 108 of FIG. 1 are cut off due to no activation of the top portion 108a of FIG. 1. The keeper circuit 106 is holding the value of the dyn_node at this phase. At the end of the hold phase, the STRB signal becomes high. With transition from 0 to 1 at the STRB signal, the OUT signal does not change from the operation of the cross-coupled NAND of the conversion circuit 110 of FIG. 1.

Right after the STRB transition, the PC signal becomes low. This is the beginning of a precharge phase. The dyn_node becomes high at the precharge phase. Since the STRB signal was high at the beginning of the precharge phase, the OUT signal does not change with the transition of the PC signal.

Figure 3:
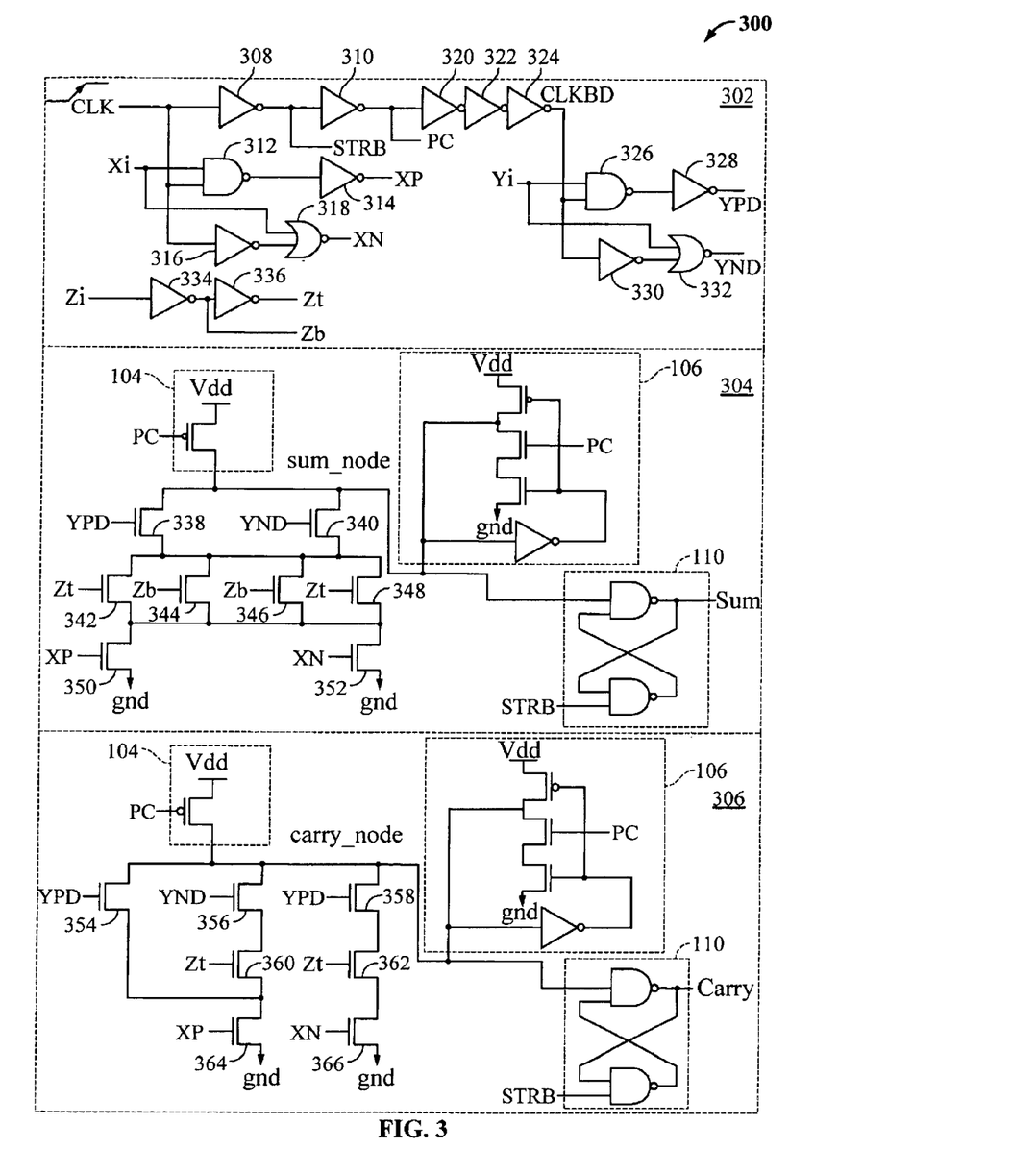
FIG. 3 depicts a schematic diagram of a full adder circuit example of the integrated logic and latch circuit of FIG. 1 when the full adder is configured to be activated with rising edge of clock.

Now referring to FIG. 3, a schematic diagram shows a full adder circuit example 300 of the integrated logic and latch circuit of FIG. 1 when the full adder is configured to be activated with rising edge of clock. The full adder circuit 300 largely comprises a clock gating circuit 302, a sum circuit 304, and a carry circuit 306. Since the full adder has two outputs (i.e., sum and carry), two circuits 304 and 306 are used to generate these two outputs. Each of these circuits adopts the configuration shown in FIG. 1, according to the present invention. Also, each of these circuits receives static signal inputs (Xi, Yi, and Zi) and a clock signal CLK from the clock gating circuit 302.

The clock gating circuit 302 comprises a first inverter 308, a second inverter 310, a first NAND gate 312, a third inverter 314, a fourth inverter 316, a first NOR gate 318, a fifth inverter 320, a sixth inverter 322, a seventh inverter 324, a second NAND gate 326, an eighth inverter 328, a ninth inverter 330, a second NOR gate 332, a tenth inverter 334, and an eleventh inverter 336.

The first inverter 308 receives the clock signal CLK and generates an STRB signal. The second inverter 310 is coupled to the first inverter 308 for receiving the STRB signal and generates a PC signal. The fifth inverter 320 is coupled to the second inverter for receiving the PC signal, which goes through the fifth, sixth, and seventh inverters 320, 322, 324. The seventh inverter 324 generates a CLKBD signal.

A first static signal input Xi is input to both the first NAND gate 312 and the first NOR gate 318. The clock signal CLK is input to both the first NAND gate 312 and the fourth inverter 316. The inverted CLK is then input to the other input of the first NOR gate 318. The third inverter 314 is coupled to the first NAND gate 312 and generates a first dynamic signal input XP. The first NOR gate 318 generates a first complement dynamic signal input XN.

Likewise, a second static signal input Yi is input to both the second NAND gate 326 and the second NOR gate 332. The CLKBD signal is input to both the second NAND gate 326 and the ninth inverter 330. The CLKBD signal is inverted and then input to the other input of the second NOR gate 332. The eighth inverter 328 is coupled to the second NAND gate 326 and generates a second dynamic signal input YPD. The second NOR gate 332 generates a second complement dynamic signal input YND.

The tenth inverter 334 receives a third static signal input Zi and generates Zb. The eleventh inverter 336 is coupled to the tenth inverter 334 for receiving Zb and generating Zt.

The sum circuit 304 and the carry circuit 306 each include the precharge circuit 104, the keeper circuit 106, and the conversion circuit 110 of FIG. 1. In each of the sum circuit 304 and the carry circuit 306, the remaining circuit component corresponds to the evaluation logic circuit 108 of FIG. 1. The details of the evaluation logic circuits in the sum circuit 304 and the carry circuit 306 is determined based on the logic to be implemented.

The sum circuit 304 further comprises first through eighth NMOS transistors respectively numbered 338, 340, 342, 344, 346, 348, 350, and 352. These transistors are respectively gated by YPD, YND, Zt, Zb, Zb, Zt, XP, and XN.

The first NMOS transistor 338 is coupled to both the third NMOS transistor 342 and the fourth NMOS transistor 344, both of which are coupled to the seventh NMOS transistor 350. The first NMOS transistor 338, the third NMOS transistor 342, the fourth NMOS transistor 344, and the seventh NMOS transistor 350 are coupled between a dynamic node sum_node and ground. The sum_node corresponds to the dyn_node of FIG. 1 and is converted to an output Sum by the conversion circuit 110. Likewise, the second NMOS transistor 340 is coupled to both the fifth NMOS transistor 346 and the sixth NMOS transistor 348, both of which are coupled to the eighth NMOS transistor 352. The second NMOS transistor 340, the fifth NMOS transistor 346, the sixth NMOS transistor 348, and the eighth NMOS transistor 352 are coupled between the dynamic node sum_node and ground.

The carry circuit 306 further comprises ninth through fifteenth NMOS transistors respectively numbered 354, 356, 358, 360, 362, 364, and 366. These transistors are respectively gated by YPD, YND, YPD, Zt, Zt, XP, and XN. The ninth NMOS transistor 354 is coupled between a dynamic node carry_node and the fourteenth NMOS transistor 364, which is coupled to ground. The carry_node corresponds to the dyn_node of FIG. 1 and is converted to an output Carry by the conversion circuit 110. The tenth NMOS transistor 356 and the twelfth NMOS transistor 360 are coupled in series between the carry_node and the fourteenth NMOS transistor 364. The eleventh NMOS transistor 358, the thirteenth NMOS transistor 362, and the fifteenth NMOS transistor 366 are coupled in series between the carry_node and ground.

Based on the aforementioned operation of the integrated logic and latch circuit 100 of FIG. 1 and the given circuit topology of the full adder 300, the detailed operation of the full adder 300 may be understood by a person of ordinary skill in the art without further explanation and is therefore not included herein.

Figure 4:
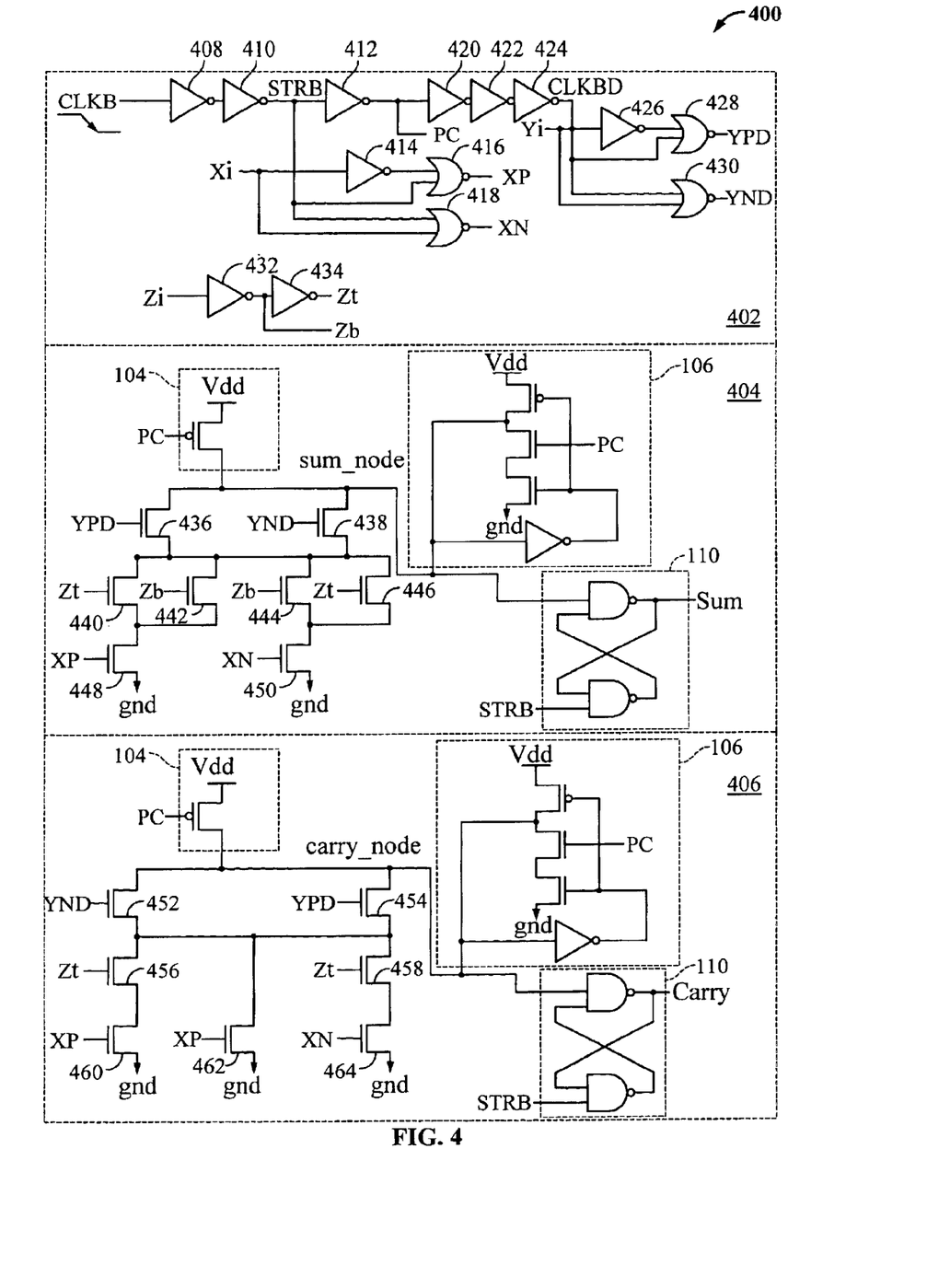
FIG. 4 depicts a schematic diagram of a full adder circuit example of the integrated logic and latch circuit of FIG. 1 when the full adder is configured to be activated with falling edge of clock.

In FIG. 4, a schematic diagram shows a full adder circuit example 400 of the integrated logic and latch circuit of FIG. 1 when the full adder is configured to be activated with falling edge of clock. The full adder circuit 400 largely comprises a clock gating circuit 402, a sum circuit 404, and a carry circuit 406. Since the full adder has two outputs (i.e., sum and carry), two circuits 404 and 406 are used to generate these two outputs. Each of these circuits adopts the configuration shown in FIG. 1, according to the present invention. Also, each of these circuits receives static signal inputs (Xi, Yi, and Zi) and a clock signal CLK from the clock gating circuit 402.

The clock gating circuit 402 comprises a first inverter 408, a second inverter 410, a third inverter 412, a fourth inverter 414, a first NOR gate 416, a second NOR gate 418, a fifth inverter 420, a sixth inverter 422, a seventh inverter 424, an eighth inverter 426, a third NOR gate 428, a fourth NOR gate 430, a ninth inverter 432, and a tenth inverter 434.

The first inverter 408 receives an inverted clock signal CLKB. The second inverter 410 is coupled to the first inverter 408 and generates an STRB signal. The third inverter 412 is coupled to the second inverter 410 for receiving the STRB signal and generates a PC signal. The fifth inverter 420 is coupled to the third inverter 412 for receiving the PC signal, which goes through the fifth, sixth, and seventh inverters 420, 422, 424. The seventh inverter 424 generates a CLKBD signal.

A first static signal input Xi is input to both the fourth inverter 414 and the second NOR gate 418. The STRB signal is input to both the first NOR gate 416 and the second NOR gate 418. The first NOR gate 416 is also coupled to the fourth inverter 414 for receiving an inverted Xi. The first NOR gate 416 and the second NOR gate 418 generate a first dynamic signal input XP and a first complement dynamic signal input XN, respectively.

Likewise, a second static signal input Yi is input to both the eighth inverter 426 and the fourth NOR gate 430. The CLKBD signal is input to both the third NOR gate 428 and the fourth NOR gate 430. The third NOR gate 428 is also coupled to the eighth inverter 426 for receiving an inverted Yi. The third NOR gate 428 and the fourth NOR gate 430 generate a second dynamic signal input YPD and a second complement dynamic signal input YND, respectively.

The ninth inverter 432 receives a third static signal input Zi and generates Zb. The tenth inverter 434 is coupled to the ninth inverter 432 for receiving Zb and generating Zt.

The sum circuit 404 and the carry circuit 406 each include the precharge circuit 104, the keeper circuit 106, and the conversion circuit 110 of FIG. 1. In each of the sum circuit 304 and the carry circuit 306, the remaining circuit component corresponds to the evaluation logic circuit 108 of FIG. 1. The details of the evaluation logic circuits in the sum circuit 404 and the carry circuit 406 are determined based on the logic to be implemented.

The sum circuit 404 further comprises first through eighth NMOS transistors respectively numbered 436, 438, 440, 442, 444, 446, 448, and 450. These transistors are respectively gated by YPD, YND, Zt, Zb, Zb, Zt, XP, and XN.

The first NMOS transistor 436 is coupled to both the third NMOS transistor 440 and the fourth NMOS transistor 442, both of which are coupled to the seventh NMOS transistor 448. The first NMOS transistor 436, the third NMOS transistor 440, the fourth NMOS transistor 442, and the seventh NMOS transistor 448 are coupled between a dynamic node sum_node and ground. The sum_node corresponds to the dyn_node of FIG. 1 and is converted to an output Sum by the conversion circuit 110. Likewise, the second NMOS transistor 438 is coupled to both the fifth NMOS transistor 444 and the sixth NMOS transistor 446, both of which are coupled to the eighth NMOS transistor 450. The second NMOS transistor 438, the fifth NMOS transistor 444, the sixth NMOS transistor 446, and the eighth NMOS transistor 450 are coupled between the dynamic node sum_node and ground.

The carry circuit 406 further comprises ninth through fifteenth NMOS transistors respectively numbered 452, 454, 456, 458, 460, 462, and 464. These transistors are respectively gated by YND, YPD, Zt, Zt, XP, XP, and XN. The ninth NMOS transistor 452, the eleventh NMOS transistor 456, and the thirteenth NMOS transistor 460 are coupled in series between a dynamic node carry_node and ground. The tenth NMOS transistor 454 is coupled in series with both the fourteenth NMOS transistor 462 and the twelfth NMOS transistor 458. The carry_node corresponds to the dyn_ node of FIG. 1 and is converted to an output Carry by the conversion circuit 110. The twelfth NMOS transistor 458 is also coupled to the fifteenth NMOS transistor 464. The tenth NMOS transistor 454 is also coupled to the dynamic node carry_node. The fourteenth NMOS transistor 462 and the fifteenth NMOS transistor 464 are also coupled to ground.

Based on the aforementioned operation of the integrated logic and latch circuit 100 of FIG. 1 and the given circuit topology of the full adder 400, the detailed operation of the full adder 400 may be understood by a person of ordinary skill in the art without further explanation and is therefore not included herein.

It will be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

What is claimed is:

1. A method for implementing a logic circuit with integrated logic and latch design, the method comprising the steps of:

providing a clock input to the logic circuit;

providing one or more static signal inputs to the logic circuit;

generating one or more dynamic signal inputs by dynamically gating the one or more static signal inputs with the clock signal, wherein the step of generating is at least partially performed by a first AND logic circuit within the logic circuit that is at least configured to receive the clock signal and a static signal input;

applying the one or more dynamic signal inputs to the logic circuit;

generating one or more dynamic signal outputs of the logic circuit;

precharging the one or more dynamic signal outputs based on the clock signal;

evaluating the one or more dynamic signal outputs when the one or more dynamic signal outputs are not being precharged;

holding the one or more dynamic signal outputs when the one or more dynamic signal outputs are neither being precharged nor being evaluated; and converting the one or more dynamic signal outputs into one or more static signal outputs.

2. The method of claim 1, wherein the one or more static signal inputs comprise complementary static signal inputs.

3. The method of claim 1, wherein the one or more dynamic signal inputs comprise one or more delayed signal inputs.

4. The method of claim 1, further comprising the step of applying one or more static signal inputs to the logic circuit.

5. The method of claim 1, wherein the step of evaluating the one or more dynamic signal outputs follows the step of precharging the one or more dynamic signal outputs.

6. The method of claim 1, wherein the step of holding the one or more dynamic signal outputs follows the step of evaluating the one or more dynamic signal outputs.

7. An apparatus for implementing a logic circuit with integrated logic and latch design, the method comprising:
    means for providing a clock input to the logic circuit;
    means for providing one or more static signal inputs to the logic circuit;
    means for generating one or more dynamic signal inputs by dynamically gating the one or more static signal inputs with the clock signal, wherein the step of generating is at least partially performed by a first AND logic circuit within the logic circuit that is at least configured to receive the clock signal and a static signal input;
    means for applying the one or more dynamic signal inputs to the logic circuit;
    means for generating one or more dynamic signal outputs of the logic circuit;
    means for precharging the one or more dynamic signal outputs based on the clock signal;
    means for evaluating the one or more dynamic signal outputs when the one or more dynamic signal outputs are not being precharged;
    means for holding the one or more dynamic signal outputs when the one or more dynamic signal outputs are neither being precharged nor being evaluated; and
    means for conveting the one or more dynamic signal outputs into one or more static signal outputs.

8. The apparatus of claim 7, wherein the one or more static signal inputs comprise complementary static signal inputs.

9. The apparatus of claim 7, wherein the one or more dynamic signal inputs comprise one or more delayed signal inputs.

10. The apparatus of claim 7, further comprising means for applying one or more static signal inputs to the logic circuit.

11. A logic circuit with integrated logic and latch design comprising:
    a clock gating circuit configured for receiving a clock signal and one or more static signal inputs and for generating one or more dynamic signal inputs by dynamically gating the one or more static signal inputs with the clock signal, wherein the clock gating circuit further comprises a first AND logic circuit for receiving the clock signal and the first static signal input and for generating a first dynamic signal input;
    an evaluation logic circuit coupled both to the clock gating circuit for receiving the one or more dynamic signal inputs and to a dynamic node for carrying a dynamic signal output of the evaluation logic circuit;
    a precharge circuit coupled to the dynamic node for precharging the dynamic node based on the clock signal, the dynamic node being evaluated when the precharge circuit is not precharging the dynamic node;
    a keeper circuit coupled to the dynamic node for holding the dynamic signal output when the dynamic node is neither being precharged nor being evaluated; and
    a conversion circuit coupled to the dynamic node for converting the dynamic signal output into a static signal output.

12. A logic circuit with integrated logic and latch design comprising:
    a clock gating circuit configured for receiving a clock signal and one or more static signal inputs and for generating one or more dynamic signal inputs by dynamically gating the one or more static signal inputs with the clock signal;
    an evaluation logic circuit coupled both to the clock gating circuit for receiving the one or more dynamic signal inputs and to a dynamic node for carrying a dynamic signal output of the evaluation logic circuit;
    a precharge circuit coupled to the dynamic node for precharging the dynamic node based on the clock signal, the dynamic node being evaluated when the precharge circuit is not precharging the dynamic node;
    a keeper circuit coupled to the dynamic node for holding the dynamic signal output when the dynamic node is neither being precharged nor being evaluated;
    a conversion circuit coupled to the dynamic node for converting the dynamic signal output into a static signal output;
    wherein the one or more static signal inputs comprise first, second, and third static signal inputs, and wherein the clock gating circuit further comprises:
        a first AND logic circuit for receiving the clock signal and the first static signal input and for generating a first dynamic signal input;
        a first inverter for receiving the first static signal input and for generating a first complement static signal input;
        a second AND logic circuit for receiving the clock signal and coupled to the first inverter for receiving the first complement static signal input, the second AND logic circuit generating a first complement dynamic signal input;
        a second inverter for receiving the clock signal and for generating an STRB signal;
        a third inverter coupled to the second inverter for receiving the STRB signal and for generating a PC signal;
        a delay block coupled to the third inverter for receiving the PC signal and for generating a CLKBD signal;
        a third AND logic circuit coupled to the delay block for receiving the CLKBD signal and configured for receiving the second static signal input, the third AND logic circuit generating a second dynamic signal input;
        a fourth inverter for receiving the second static signal input and for generating a second complement static signal input;
        a fourth AND logic circuit for receiving the CLKBD signal and coupled to the fourth inverter for receiving the second complement static signal input, the fourth AND logic circuit generating a second complement dynamic signal input; and
        a fifth inverter for receiving the third static signal input and for generating a third complement static signal input.

13. The logic circuit of claim 12, wherein the precharge circuit comprises an electronic switch coupled between a supply voltage and the dynamic node and coupled to the clock gating circuit for receiving the PC signal, the PC signal controlling the electronic switch.

14. The logic circuit of claim 13, wherein the electronic switch comprises a p-channel metal-oxide-silicon (PMOS) transistor having source, gate, and drain terminals, the source terminal being coupled to the supply voltage, the gate terminal being coupled to the clock gating circuit for receiving the PC signal, and the dram terminal being coupled to the dynamic node.

15. The logic circuit of claim 12, wherein the keeper circuit comprises:
- a sixth inverter coupled to the dynamic node for receiving the dynamic signal output and generating an inverted dynamic signal output;
- a first electronic switch coupled between a supply voltage and the dynamic node and coupled to the sixth inverter for receiving the inverted dynamic signal output as a control signal; and
- second and third electronic switches coupled in series between the dynamic node and ground, the second electronic switch being coupled to the clock gating circuit for receiving the PC signal as a control signal, and the third electronic switch being coupled to the sixth inverter for receiving the inverted dynamic signal output as a control signal.

16. The logic circuit of claim 15, wherein the first electronic switch comprises a p-channel metal-oxide-silicon (PMOS) transistor, and wherein the second and third electronic switches each comprise an n-channel metal-oxide-silicon (NMOS) transistor.

17. The logic circuit of claim 12, wherein the conversion circuit comprises a cross-coupled NAND coupled to the dynamic node for receiving the dynamic signal output and to the clock gating circuit for receiving the CLKBD signal.

18. The logic circuit of claim 12, wherein the evaluation logic circuit comprises a tree of electronic switches, the tree being coupled between the dynamic node and ground.

19. The logic circuit of claim 18, wherein the tree comprises top, middle, and bottom portions, wherein the top portion is coupled to the clock gating circuit for receiving the second dynamic signal input and the second complement dynamic signal input, and wherein the bottom portion is coupled to the clock gating circuit for receiving the first dynamic signal input and the first complement dynamic signal input.

20. The logic circuit of claim 19, wherein the middle portion is coupled to the clock gating circuit for receiving the third static signal input.

21. The logic circuit of claim 19, wherein the middle portion is coupled to the clock gating circuit for receiving the third complement static signal input.

22. The logic circuit of claim 19, wherein the middle portion is coupled to the clock gating circuit for receiving both the third static signal input and the third complement static signal input.

23. The logic circuit of claim 18, wherein the electronic switches each comprise an n-channel metal-oxide-silicon (NMOS) transistor.

* * * * *